(12) United States Patent
Hsieh

(10) Patent No.: US 7,528,399 B1
(45) Date of Patent: May 5, 2009

(54) CONTROLLING APPARATUS FOR GATE DRIVING SIGNAL

(75) Inventor: Wen-Cheng Hsieh, Taoyuan Shien (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 12/017,319

(22) Filed: Jan. 21, 2008

(51) Int. Cl.
*G02B 27/00* (2006.01)

(52) U.S. Cl. ..................................... 250/551

(58) Field of Classification Search ................. 250/551, 250/214 R
See application file for complete search history.

(56) References Cited

U.S. PATENT DOCUMENTS 6,181,189 B1 * 1/2001 Endo et al. .................. 327/333

* cited by examiner

Primary Examiner—Thanh X Luu

(57) ABSTRACT

A controlling apparatus for gate driving signal controls a gate of a power unit through a photo coupler includes a processor, a gate-controlling IC electrically connected to the processor and sending a gate driving signal of the processor to the gate, a transistor switch electrically connected to the photo coupler, and an isolation multiple input unit. The isolation multiple input unit has one output end connected to the processor, and connected to the gate-controlling IC through a hardware enable jumper. The transistor switch is controlled by a second control signal to turn off the gate. When hardware enable jumper is removed, the isolation multiple input unit is able to disable the gate-controlling IC for safety concern. When safety is not concern, the hardware enable jumper can be mounted to enable the gate-controlling IC. At this moment, the isolation multiple input unit can provide addition input.

7 Claims, 2 Drawing Sheets

CONTROLLING APPARATUS FOR GATE DRIVING SIGNAL

BACKGROUND OF THE INVENTION

1. Field of the Invention

The present invention relates to a controlling apparatus for gate driving signal, especially to a controlling apparatus for gate driving signal with simple circuit layout and enhanced terminal utilization efficiency.

2. Description of Prior Art

Industrial safety and equipment safety become serious concern as the advance of technology and demand on life quality. For example, performance levels (PL) and safety integrity levels (SIL) are two popular industrial standards for safety of electronic control system. The two standards have different regulation to provide corresponding protection. PL standard is first enacted in 1990s, which is part of EN954-1 and supports EU machinery Directive The degree of malfunction in a machine or system can be classified into Category B, 1, 2, 3 and 4 in view of endurance for malfunction and performance under malfunction condition. More particularly, Category 3 safety standard provides enhanced safety by redundancy and dual-channel skill. Moreover, the malfunction can also be detected. For example, Rockwell has developed a Safe-Off protection scheme with redundancy approach.

FIG. 1 shows the block diagram of a prior art apparatus 10 for controlling gate driving signal, which mainly comprises a processor 100, a first gate-controlling integrated circuit (IC) 120, and a second gate-controlling IC 140. The processor 100, the first gate-controlling IC 120, and the second gate-controlling IC 140 are in serial connection to convey a gate driving signal. The gate driving signal is sent to a photo coupler 160 to control a gate (not shown) of a power unit (not labeled), wherein the power unit is an IGBT inverter.

The first gate-controlling IC 120 comprises an output end electrically connected to an isolation multiple input unit 180 to receive external signal. The isolation multiple input unit comprises an input end electrically connected to an enable jumper 182 for receiving an external enable signal. The second gate-controlling IC 140 is electrically connected to an optional safe relay 150 in order to receive a control signal from the safe relay 150. The processor 100 receives four control signal SA, SB, SC and SD. The control signal SA detects whether the safe relay 150 is correctly installed. The control signal SB detects whether the safe relay 150 has normal operation. The control signal SC detects whether the first gate-controlling IC 120 has normal operation. The control signal SD detects whether the second gate-controlling IC 140 has normal operation. The provision of the enable jumper 182 and the safe relay 150 enables user to disable the gate driving signal, thus preventing the malfunction due to single circuit.

However, in above-mentioned apparatus 10 for controlling gate driving signal, the cost is high and larger area is occupied in PCB because two gate-controlling ICs are required. Moreover, the isolation multiple input unit 180 has one input end connected tot the enable jumper 182, the input end is waste when safety is not a concern.

SUMMARY OF THE INVENTION

It is an object of the present invention to provide a controlling apparatus for gate driving signal with simple circuit layout and enhanced terminal utilization efficiency.

Accordingly, the present invention provides a controlling apparatus for gate driving signal to control a gate of a power unit through a photo coupler. The controlling apparatus includes a processor, a gate-controlling IC electrically connected to the processor and sending a gate driving signal of the processor to the gate, a transistor switch electrically connected to the photo coupler, and an isolation multiple input unit. The isolation multiple input unit has one output end connected to the processor, and connected to the gate-controlling IC through a hardware enable jumper. The transistor switch is controlled by a second control signal to turn off the gate. When hardware enable jumper is removed, the isolation multiple input unit is able to disable the gate-controlling IC for safety concern. When safety is not concern, the hardware enable jumper can be mounted to enable the gate-controlling IC. At this moment, the isolation multiple input unit can provide addition input.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
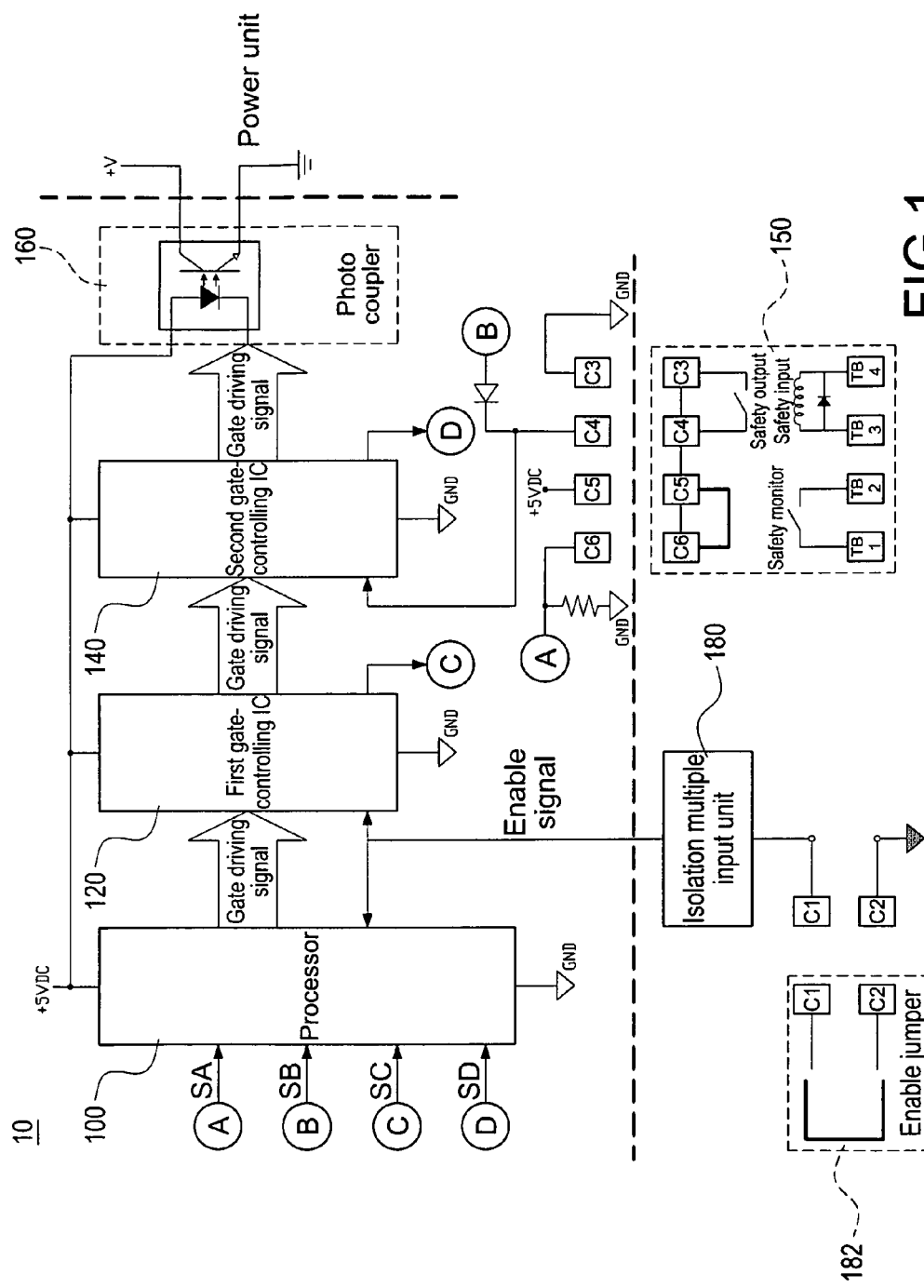
FIG. 1 shows the block diagram of a prior art apparatus 10 for controlling gate driving signal.
Figure 2:
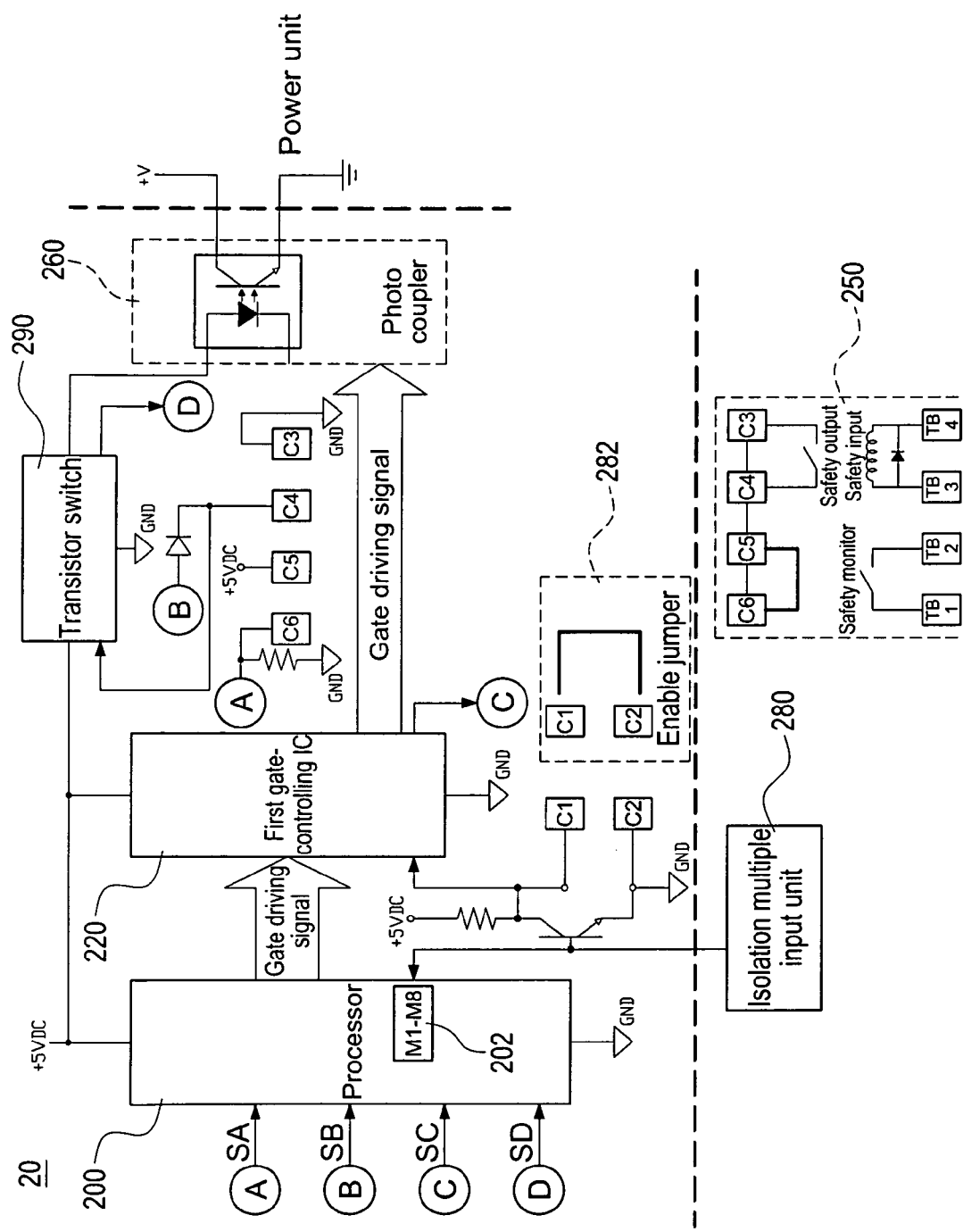
FIG. 2 shows the block diagram of the apparatus 20 for controlling gate driving signal according to the present invention.

FIG. 2 shows the block diagram of the apparatus 20 for controlling gate driving signal according to the present invention, which mainly comprises a processor 200, a gate-controlling IC 220 serially connected to the processor 200, a photo coupler 260 receives a gate controlling signal of the gate-controlling IC 220, a transistor switch 290 electrically connected to an anode in an LED (not shown) of the photo coupler 260, a power source (+5VDC) and an output of a safe relay 250.

The controlling apparatus 20 further comprises an isolation multiple input unit 280 electrically connected to one end of the processor 200 and a hardware enable jumper 282. The enable jumper 282 is provided to keep the gate-controlling IC 220 in an enabled state.

The controlling apparatus 20 further comprises an optional safe relay 250, which receives a control signal from user to selectively turn off the transistor switch 290.

The processor 100 receives four control signal SA, SB, SC and SD. The control signal SA detects whether the safe relay 250 is correctly installed. The control signal SB detects whether the safe relay 250 has normal operation. The control signal SC detects whether the gate-controlling IC 220 has normal operation. The control signal SD detects whether the transistor switch 290 has normal operation.

With reference again to FIG. 2, when the enable jumper 282 is removed, the gate-controlling IC 220 is controlled by the isolation multiple input unit 280. In other word, when the isolation multiple input unit 280 receives a stop command from user, the gate-controlling IC 220 no longer outputs a gate driving signal and the power unit stops its function. Moreover, when the enable jumper 282 is connected to the isolation multiple input unit 280, the input status of the isolation multiple input unit 280 has no effect to the gate-controlling IC 220. The isolation multiple input unit 280 provides the input signal thereof to input port 202 of the processor 200. Therefore, the isolation multiple input unit 280 provides additional input after it does not need to control the gate-controlling IC 220. The gate-controlling IC 220 is kept enabled by the enable jumper 282.

More particularly, the enable jumper 282 is used when dual safety is not necessary. In this situation, the operation of the gate-controlling IC 220 is independent with the input of the isolation multiple input unit 280. Therefore, the isolation multiple input unit 280 can spare one input end for the input port 202 of the processor 200. The utilization rate of the pins for the isolation multiple input unit 280 is enhanced.

Moreover, the controlling apparatus 20 uses the transistor switch 290 to replace the function of another gate-controlling IC to simplify circuit layout. The transistor switch 290 is controlled by the safe relay 250 to turn off the photo coupler 260. Therefore, the gate controlling signal is disabled for protection. Moreover, the enable jumper 282 can be removed such that the gate-controlling IC 220 is controlled by the isolation multiple input unit 280. The isolation multiple input unit 280 can receive a first control signal to disable the gate-controlling IC 220 when the enable jumper 282 is removed, thus providing dual protection.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A controlling apparatus for gate driving signal, the controlling apparatus controlling a gate of a power unit through a photo coupler, the controlling apparatus comprising:

a processor;

a gate-controlling integrated circuit electrically connected to the processor and sending a gate controlling signal of the processor to the photo coupler;

a transistor switch electrically connected to an anode of a light emitting diode of the photo coupler, the transistor switch being controlled by a second control signal to turn off the photo coupler;

an isolation multiple input unit with one input electrically connected to the processor, the isolation multiple input unit electrically connected to the gate-controlling integrated circuit through a hardware enable jumper;

wherein the gate-controlling integrated circuit is not controlled by the isolation multiple input unit, and the isolation multiple input unit provides input function to the processor when the hardware enable jumper is mounted.

2. The controlling apparatus in claim 1, wherein the isolation multiple input unit is configured to disable the gate-controlling integrated circuit when the hardware enable jumper is removed and the isolation multiple input unit receives a first control signal.

3. The controlling apparatus in claim 1, wherein the second control signal is sent to the transistor switch through a safety relay.

4. The controlling apparatus in claim 3, wherein the processor is configured to receive a third control signal to identify whether the safety relay is installed.

5. The controlling apparatus in claim 3, wherein the processor is configured to receive a fourth control signal to identify whether the safety relay has normal operation.

6. The controlling apparatus in claim 1, wherein the processor is configured to receive a fifth control signal to identify whether the gate-controlling integrated circuit has normal operation.

7. The controlling apparatus in claim 1, wherein the processor is configured to receive a sixth control signal to identify whether the transistor switch has normal operation.

* * * * *